United States Patent [19]

Gaudenzi

[11] Patent Number: 4,954,738
[45] Date of Patent: Sep. 4, 1990

[54] CURRENT SOURCE TECHNOLOGY
[75] Inventor: Gene J. Gaudenzi, Purdys, N.Y.
[73] Assignee: International Business Machines Corporation, Armonk, N.Y.
[21] Appl. No.: 497,758
[22] Filed: Mar. 20, 1990

Related U.S. Application Data

[63] Continuation of Ser. No. 197,779, May 23, 1988, abandoned.
[51] Int. Cl.$^5$ ................ H03K 19/013; H03K 19/086; H03K 5/12
[52] U.S. Cl. .................................... 307/454; 307/443; 307/455; 307/456; 307/263
[58] Field of Search ........................ 307/443, 454–456, 307/263, 542, 546

[56] References Cited

U.S. PATENT DOCUMENTS 4,605,870  8/1986  Dansky .

OTHER PUBLICATIONS

IBM Tech. Disc. Bul., "Microwatt CCG Circuit with VFET Feedback Loop", vol. 26, No. 3A, Aug. 1983.
Technical Disclosure Bulletin, vol. 24, No. 6, Nov. 1981, "Current-Controlled Gate Push-Pull Dotting", by A. H. Dansky, J. P. Norsworthy and C. D. Waggoner.
IBM Technical Disclosure Bulletin, vol. 24, No. 11A, Apr. 1982, "Active Pull-Down Circuit for Current-Controlled Gate", by A. H. Dansky and J. P. Norsworthy.
IBM Technical Disclosure Bulletin, vol. 26, No. 9, Feb. 1984, "Controlled Output Transistion TTL Driver", by G. J. Gaudenzi, R. E. Johnson and D. C. Reedy.

Primary Examiner—Stanley D. Miller
Assistant Examiner—Margaret Rose Wambach
Attorney, Agent, or Firm—Graham S. Jones, II

[57] ABSTRACT

A circuit includes a set of seven NPN transistors, a Schottky diode, and several resistors. The signal is connected from the input section to the output section directly from the base of a transistor in the input circuit to the base of the lower output transistor, which is connected with its collector emitter connections in parallel with the emitter resistor of the input transistors which receive the input signals to the circuit. Two transistors are connected to input terminals to provide a possible NOR arrangement although one of them alone can be used if the requirement of the circuit is simply for an inverter circuit. The output transistors comprise a push-pull output section.

5 Claims, 2 Drawing Sheets

CURRENT SOURCE TECHNOLOGY

This application is a continuation of application Ser. No. 197779, filed 5/23/88, now abandoned.

BACKGROUND OF THE INVENTION

1. Field of the Invention

This invention pertains to semiconductor digital circuits.

2. Background Information

Prior Art

U.S. Pat. No. 4,605,870 of Dansky and Norsworthy for "High Speed Low Power Current Controlled Gate Circuit" shows six NPN transistors, a resistor, and a low barrier Schottky diode LB connected in three variations of a circuit. In each case the lower output transistor in a push-pull arrangement has its collector driven by a PNP transistor with its base shorted to its emitter which serves as a base-to-collector diode which enables capacitive coupling of the input signal to the base of the lower output transistor in the push-pull output section. The base-to-collector diode PNP transistor carries a substantial amount of current, which can be reduced employing the circuit of this invention.

An object of this invention is to use of current source technology to obtain high performance (less than 1 nsec delay) bipolar circuits at low power dissipation. The gate circuit of this invention offers excellent power dissipation characteristics. A gate circuit in accordance with this invention offers an excellent speed times power product, one competitive with CMOS and BICMOS, in gate array product programs employing +5 Volt and 0 Volt power supplies.

DESCRIPTION OF THE PREFERRED EMBODIMENTS

Figure 1:
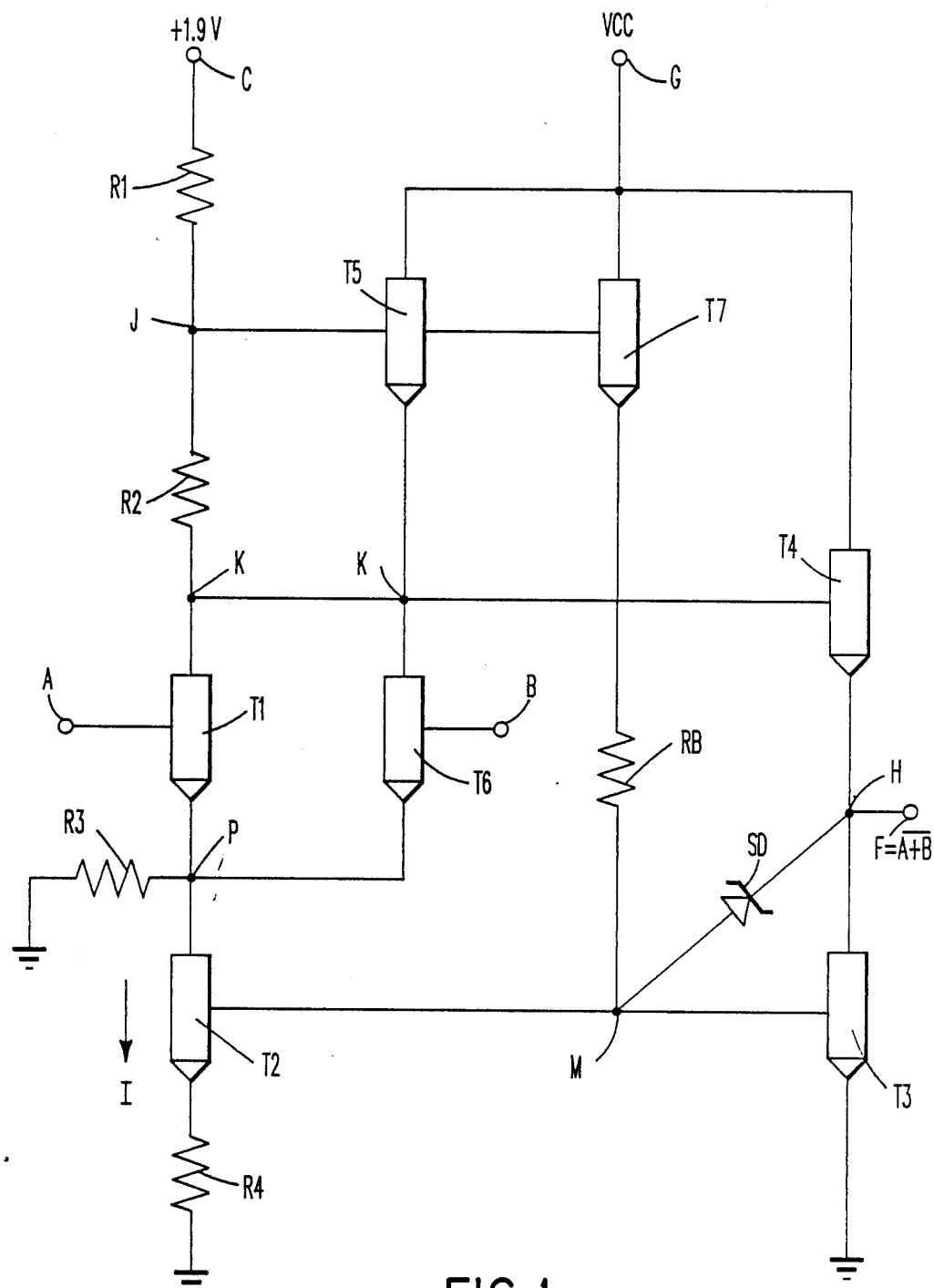
FIG. 1 shows a gate circuit employing NPN transistors connected in a circuit in accordance with this invention.

FIG. 1 shows a circuit in accordance with this invention including a set of seven NPN transistors T1-T7, Schottky diode SD, resistors R1 to R4 and RB, B+ terminal C, and VCC terminal G. None of the transistors has its base-emitter circuit shorted out as in Dansky et al above and the signal is connected from the input section to the output section directly from the base of a transistor T2 in the input circuit to the base of the lower output transistor T3. Transistor T2 is connected with its collector emitter connections in parallel with the emitter resistor R3 of the input transistors T1 and T6 which receive the input signals to the circuit at terminals A and B. The input section comprises transistors T1, T2, T5, T6 and T7. Transistors T1 and T6 are connected to input terminals A and B to provide a possible NOR arrangement although one of T1 and T6 alone can be provided if the requirement of the circuit is simply for an inverter circuit. The transistors T2, T5, and T7 complete the five transistor input section. Transistors T3 and T4 comprise the push-pull output section. Transistor T4 serves as a pull-up emitter follower. Diode SD provides capacitive coupling from the base of transistor T3 to its collector.

Resistor R1 is connected between B+ potential of 1.9 Volts at terminal C and node J which is connected to the base of transistor T5 and to the upper end of resistor R2. The opposite end of resistor R2 is connected through node K to the collector of transistor T1. The base of transistor T1 is connected to one of the input terminals A of the circuit of FIG. 1, which is one of the two input terminals A and B for the circuit of FIG. 1. The emitter of transistor T1 is connected along with the emitter of transistor T6 through node P to one end of resistor R3 which connects at its opposite end to ground. Node P also connects to the collector of transistor T2. The emitter of transistor T2 is connected though resistor R4 to ground. Node G is connected between voltage source VCC and the collectors of transistors T4, T5, and T7. The bases of transistors T5 and T7 are both connected to the node J between resistors R1 and R2 to receive the voltage set by transistors T1 and T6 in response to their base voltages set by inputs on terminals A and B. The emitter of transistor T5 is connected via node K to the collectors of transistors T1 and T6 and to the base of output transistor T4. As indicated above, the collector of transistor T6 is connected to node K, the base is connected to input terminal B and the emitter is connected to node P. The collector of transistor T2 is also connected to node P through which current $I_{R4}$ passes via transistor T2. The base of transistor T2 is connected to node M, and its emitter is connected to the upper end of resistor R4, whose opposite end is connected to ground. The emitter of transistor T7 is connected via resistor RB to node M. Node M connects to the bases of transistors T2 and T3. In addition, node M is connected by Schottky diode SD to node H, which is connected to the output terminal F of the circuit of FIG. 1. Transistor T4 has its collector connected to terminal G, its base to node K, and its emitter to node H. Transistor T3 has its collector connected to node H its base to node M and its emitter to ground. The circuit comprises a NOR circuit with the output signal (A+B bar) at the output terminal F in response to the input signals A and B. Transistors T3 and T4 are connected in a push-pull arrangement.

The digital NOR gate of FIG. 1 is designed to operate with the transistors T2, T3, T4, T5, and T7 always remaining on with the current levels varying between high and low levels as a function of input signal levels at input terminals A and B to provide higher speeds of operation of the output transistor T4 in response to an input at terminal A or B. Note that the NOR output at terminal F is as follows:

$$F = \overline{A + B}$$

The current source gate circuit shown in FIG. 1 features a push-pull output stage, comprising transistors T3 and T4, that is dottable, i.e. the output signals of two such circuits can be connected together without disturbing the performance of either circuit dotted to the other.

When the input terminal A is down at a low voltage (0.2 V), transistor T1 must be off, causing transistor T4 to conduct, thus establishing a binary "one" level (about 1.2V). Transistor T7 senses the voltage divider such that about 10 microamperes bias current is available for a resistor RB value of about 40k ohms to transistor T2 and output transistor T3. Because the voltage on the collector of transistor T2 is at ground level, it will saturate, which is critical to the fall transition on the output.

When the voltage at input A rises, T1 will turn on fast, causing current to flow from its base through resistor R3 and the collector of transistor T2. The voltage at the base of T2 then rises quickly, as indicated by the expression, as follows:

$$V_{BT2} = V_{BET2} + I_{T2} * R4.$$

The $I_{T2}$ current spike generated is critical for raising the potential at the T2 emitter, which is required to produce the desired rapid increase in $V_{BT2}$ which raises the voltage on node M in response to the current spike. The voltage on node M raises the potential on the base of transistor T3, turning it on. The transistor T5 is employed to enhance the value of the $I_{T2}R$ current spike by assuring that the voltage on the collector of transistor T1 does not drop too low, leading to saturation. Once the output falls to a low value (about 0.25V), and transistor T1 is on in the active region, the transistor T7 emitter current drops low enough to keep the power low in response to the IR drop across the divider of resistors R1 from node C to node J and resistors R2 and R3 from node J to ground. It should be noted that the transistor T1 gain is adjusted so that in the down level of transistor T4 is allowed to conduct (about 40 microamperes), assuring good speed when pulling up. The power consumed by the circuit in the down level of node F will be dependent on the current into ground [$I_{GND}$], as defined by the expression:

$$I_{GND}(down) = I_{R3} + I_{R4} + I_{EE}(T3),$$

where $I_{R4}$ = D.C. current and $I_{EE}$ is the T3 emitter current. $I_{EE}(T3)$ is high for only a very short time, thereby reducing the power consumption of this circuit.

The value of resistor R2 is chosen such as to assure the output down level, i.e., $$Gain = (R_1 + R_2)/R3,$$

causing I to be very low in value (about 30 microamperes). The current $I_{EE}(T3)$ is dependent on the emitter area of the transistor T3 and is also kept to a low value. A key design consideration with this circuit is to make the T2 emitter area as large as possible so that, in the D. C. case, the least current is mirrored to transistor T3. As noted earlier, the current $I_{R4}$ (D. C. current) is critical for current spike generation. As a current spike is generated, the voltage represented by the IR drop (I*R4 product) is responsible for causing a current spike in T3.

Up level operation is achieved by decreasing the voltage on input terminal A such that transistor T1 turns off thereby allowing the voltage on the base of transistor T4 to rise. Output at terminal F will then sit at an up level value of +1.2V. Collector dotting of the push-pull signal at output terminal F may be achieved because the zero level is the non-controlling state. Down level current in output transistor T3 is limited to about 0.5 microamperes max. because of the mirror effect of transistors T2 and T3 and a reduction in the available base current $I_{RB}$ to transistors T3 and T4.

The gate circuit shown may be extended for operation into advanced transistor technologies, including BICMOS, by applying the concept of the disclosed current source arrangement (T7, T2 and T3) to establish the complementary output of transistors T3 and T4.

All the transistors in FIG. 1 are NPN transistors. The resistor R1 has a value of about 1.75 kohm, R2 has a value of about 1.25 kohm, resistor R3 has a value of about 2 kohm, R4 has a value of about 0.5 kohm, and RB has a value of about 40 kohm. Voltage VCC has a value of about 5.0 volts but can be in a range from 1.9 to 5.0 volts.

Operation of Circuit

A = 1

Assume that A has a binary value of "1". Terminal A is positive in value, at about 1.2 volts and transistor T1 is ON. The voltage divider (R1+R2)/R3 keeps T4 conducting while T3 is conducting. R1+R2=3 kohm and R3=2kohm. Normally one would expect a large amount of current in T3, but node K is held low at about 1 to 1.2 volts by T1 conducting to hold T3 at low current as the current through transistor T7 and RB is low, as explained above. The voltage at node P is about 0.4 Volts. Transistor T1 which is turned on has a voltage drop across the collector emitter circuit of about 0.15 Volts.

A = 0

Assume that T1, T3, T2 and T4 are on when A drops to "0". T1 turns off immediately so node K rises to about 1.9 volts so T4 turns on more and node F is then at 1.2 Volts. Since node K has risen to about 1.9 volts node J rises to raise current through transistor T7 which passes through resistor RB and node M. The current into node M splits there and passes through the base input circuits of T2 and T3. Resistor RB is large enough to limit the current into node M. Thus T2 and T3 remain conducting with T2 saturated and T3 conducts a low current, operating in a quiescent state, since the limited current through RB is split between T2 and T3.

A = 1 again

Node A rises again and turns T1 on quickly. through R3 causing node P to rise. Also, increased current through R4 raises the emitter and base potentials on T2, raising node M to turn on T3 quickly so output terminal F is pulled down fast to about 0.1 volts from 1.2 volts. Again R1 and R2 in the divider circuit with R3 provide potentials which hold current in T2 down, with the IR drop across R4 holding current down, by raising emitter potential of T2.

TABLE I

| High and Low Voltage Levels for Nodes of Circuit | | |
|---|---|---|
| Node | High | Low |
| A | 1.2 Volts | 0.2 Volts |
| F | 1.2 | 0.1 |
| K | 1.9 | 1.0 |
| M | 0.8 | 0.8 |
| P | 0.4 | 0.0 |

Figure 2:
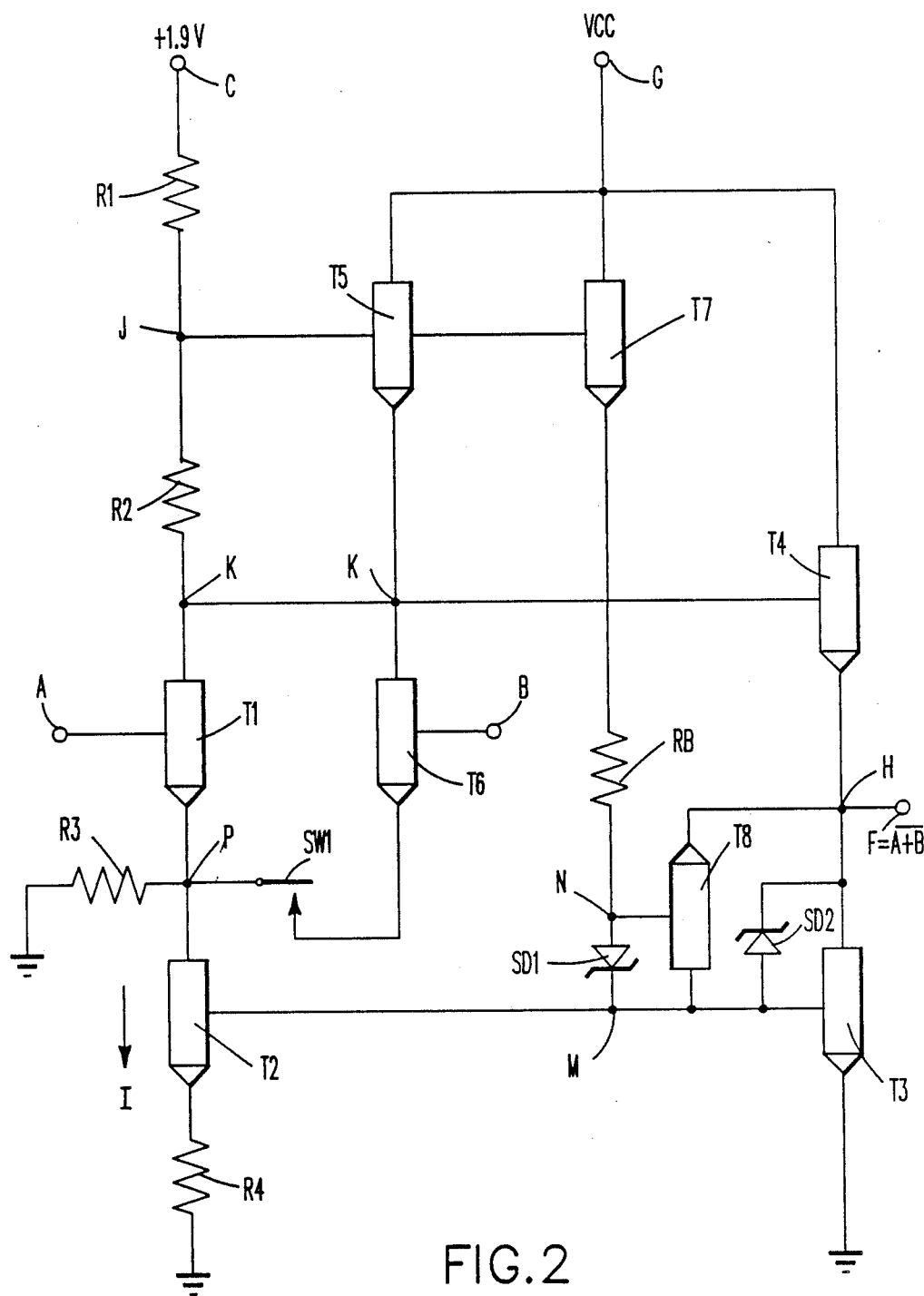
FIG. 2 shows a modification of FIG. 1.

FIG. 2 shows a modification of the circuit of FIG. 1 in the form of an inverter circuit which can be used as a gate if desired as in FIG. 1. The switch SW1 has been added to make it clear that the transistor T6 can be included in the circuit when it is desired to have a gate circuit.

The second modification of FIG. 2 is that the resistor RB is connected to the node N, instead of node M. Node N is connected to node M by an NPN transistor T8 with its base connected to node N, and its collector connected to node M, plus a Schottky diode SD1 in its base collector circuit connected to conduct in the forward direction from node N to node M. The emitter of transistor T8 is connected to node H. In addition, transistor T3 includes a Schottky diode SD2 in its collector base circuit with the diode conducting in the forward direction from node M to node H. The operation of the circuit if FIG. 2 is the same as FIG. 1, with the exception that the voltage at node H and terminal F, when it is down is at a higher potential than in FIG. 1, with the potential at 0.7 Volts instead of 0.2 Volts.

What is claimed is:

1. A high speed, low power, current-controlled logic system comprising:
   a first section including input logic means (T1) for receiving a logic input signal and providing an output current in response thereto,
   (a) an output section (T3) having an input (M), said output section (T3) providing an output signal (F) in response to a signal at said input (M) thereof,
   (b) a switching device having a lower current circuit (T7 and RB) and a higher current circuit (T2)
      (1) said higher current circuit (T2) including a higher current transistor (T2) carrying said output current from said input logic means (T1), and
      (2) said lower current circuit (T7 and RB) providing a rapid change in potential across said lower current circuit in response to a change in said higher current circuit, and
   means for coupling said rapid change in potential from said low current circuit to the input (M) of said output section (T3).

2. A logic system in accordance with claim 1 wherein
   (a) said first section includes a first transistor (T1) having
      (1) a control input terminal (A) connected for receiving said logic input signal,
      (2) a voltage divider circuit (R1, J, R2) connected in series with said first transistor (T1),
   (b) said switching device including a transistor device (T7) having its control input connected to said voltage divider circuit, said voltage divider circuit providing a signal to said transistor device (T7) reflecting the current through said first transistor (T1), said transistor device (T7) having an output circuit connected to a high impedance path connected to a central node (M),
   (c) said higher current circuit including a higher current transistor (T2) connected in series with said first transistor (T1),
   (d) said higher current transistor (T2) having a control input terminal connected to said central node (M), and
   (e) said input (T3) of said output section being connected to said central node (M).

3. A high speed, low power, current-controlled logic system comprising:
   (a) a plurality of transistors including a first, second third, fourth, fifth and sixth transistor (T1, T2, T3, T4, T5, T6 and T7,), each of said transistor shaving a base, a collector and an emitter,
   (b) a plurality of resistors including first, second, third, fourth and fifth resistors (R1, R2, R3, R4, and RB) each of said resistors having a one end and an other end,
   (c) first input, second input, and third, fourth, and output terminals (A, B, C, G, F) and ground, and
   (d) first, second, third, fourth, and fifth nodes (H, J, K, M and P),
   (e) said third and fourth terminals (C and G) being connected to bias potentials,
   (f) said first resistor (R1) being connected between said third terminal (C) and said second node (J) which is connected to said base of said fifth and seventh transistors (T5 and T7) and to said one end of said second resistor (R2),
   (g) said other end of said second resistor (R2) being connected through said third node (K) to said collector of said first transistor (T1), said base of said first transistor (T1) being connected to said first input terminal (A), said emitter of said first transistor (T1) being connected through said fifth node (P) to said emitter of said sixth transistor (T6) and to said one end of said third resistor (R3) which connects at its other end to ground,
   (h) said fourth terminal (G) being connected to said collectors of said fourth, fifth and seventh transistors (T4, T5, and T7),
   (i) said emitter of said fifth transistor (T5) being connected via said third node to said collectors of said first and sixth transistors (T1 and T6) and to said base of said fourth transistor (T4),
   (j) said base of said sixth transistor (T6) is connected to said second input terminal (B),
   (k) said bases of said fifth and seventh transistors (T5 and T7) being connected to said second node (J) between said first and second resistors (R1 and R2) to receive the voltage set by said first and sixth transistors (T1 and T6) in response to their base voltages, said base voltages being set by inputs on said first and second input terminals (A and B),
   (l) said collector of said second transistor (T2) is also connected to said fifth node (P), said base of said second transistor (T2) is connected to said fourth node M, and said emitter of said second transistor (T2 is connected to said one end of said fourth resistor (R4), said other end of said fourth resistor being connected to said ground,
   (m) said emitter of said seventh transistor (T7) being connected via said fifth resistor (RB) to said fourth node (M), said fourth node (M) connecting to said bases of said second and third transistors (T2 and T3),
   (n) said fourth node (M) is connected through a Schottky diode (SD) to said first node (H), said first node is connected to said output terminal (F),
   (o) said fourth transistor (T4) has its collector connected to said fourth node, its base to said third node (K), and its emitter to said first node (H),
   (p) said third transistor (T3) has its collector connected to said first node (H), its base to said fourth node (M) and its emitter to said ground,
   (g) said said third and fourth transistors (T3 and T4) being connected in a push-pull arrangement providing an output to said fifth terminal (F).

4. A high speed, low power, current-controlled logic system comprising:
   (a) a plurality of transistors including a first, a second, a third, a fourth, a fifth, a sixth and a seventh transistor (T1, T2, T3, T4, T5, T7 and T8), each having a base, a collector and an emitter,
   (b) first, second, third, fourth, and fifth resistors (R1, R2, R3, R4 and RB), each having a one end and an other end,
   (c) an input terminal (A), and second and third terminals (C, G,), and an output terminal (F) and ground, and (d) first, second, third, fourth, fifth and sixth nodes (H, J, K, M, P and N), and
(e) a Schottky diode (SD1) having an anode and a cathode,
(f) said second and third terminals (C and G) being connected to bias potentials,
(g) said first resistor (R1) being connected between said third terminal (C) and said second node (J) which is connected to said base of said fifth and sixth transistors (T5, T6) and to said one end of said second resistor (R2),
(h) said other end of said second resistor (R2) being connected through said third node (K) to said collector of said first transistor (T1),
(i) said base of said first transistor (T1) being connected to said input terminal (A),
(j) said emitter of said first transistor (T1) being connected through said fifth node (P) to said one end of said third resistor (R3) which connects at its other end to ground,
(k) said third terminal (G) being connected to said collectors of said fourth, fifth, and sixth transistors (T4, T5, and T7,)
(l) said bases of said fifth, and sixth transistors (T5 and T7) being connected to said second node (J) between said first and second resistors (R1 and R2) to receive the voltage set by said first transistor (T1) in response to the base voltages set by inputs on said input terminal (A),
(m) said emitter of said fifth transistor (T5) being connected via said third node (K) to said collector of said first transistor (T1) and to said base of said fourth transistor (T4),
(n) said collector of said seventh transistor (T8) being connected to said fourth node (M), said base of said seventh transistor (T8) being connected to said sixth node (N) and said emitter of said seventh transistor (T8) being connected to said first node (H),
(o) said collector of said second transistor (T2) is also connected to node (P), said base of said second transistor (T2) is connected to said fourth node (M), and said emitter of said second transistor (T2) is connected to said one end of said fourth resistor (R4), said other end of said fourth resistor (R4) being connected to said ground, said emitter of said sixth transistor (T7) being connected via said fifth resistor (RB) to said sixth node (N), said sixth node (N) connecting to said base of said seventh transistor (T8) and said anode of said Schottky diode (SD1),
(p) said cathode of said Schottky diode (SD1) is connected to said fourth node (M),
(q) said fourth transistor (T4) has its collector connected to said third terminal (G), its base to said third node (K), and its emitter to said first node (H), and
(r) said third transistor (T3) has its collector connected to said first node (H), its base to said fourth node (M) and its emitter to said ground.

5. A logic system in accordance with claim 4 wherein said fourth node (M) is connected to the anode of a second Schottky diode (SK2), the cathode of which is connected to said first node (H), which is connected to said output terminal(F), said second and third transistors (T3 and T4) being connected in a push-pull arrangement providing an output to said output terminal (F).

* * * * *